United States Patent
Lindberg et al.

(10) Patent No.: US 7,025,510 B2
(45) Date of Patent: Apr. 11, 2006

(54) MODULAR FIBER-OPTIC TRANSCEIVER

(75) Inventors: Lars Lindberg, Stockholm (SE);
Lars-Göte Svenson, Sollentuna (SE);
Edgar Goobar, Stockholm (SE)

(73) Assignee: Finisar Corporation, Sunnyvale, CA (US)

( * ) Notice: Subject to any disclaimer, the term of this patent is extended or adjusted under 35 U.S.C. 154(b) by 55 days.

(21) Appl. No.: 10/495,938

(22) PCT Filed: Nov. 22, 2002

(86) PCT No.: PCT/SE02/02143
§ 371 (c)(1),
(2), (4) Date: May 18, 2004

(87) PCT Pub. No.: WO03/044916
PCT Pub. Date: May 30, 2003

(65) Prior Publication Data
US 2004/0262600 A1   Dec. 30, 2004

(30) Foreign Application Priority Data
Nov. 23, 2001 (SE) .................................. 0103917
Dec. 14, 2001 (SE) .................................. 0104232

(51) Int. Cl.
*G02B 6/36* (2006.01)
(52) U.S. Cl. .......................................... 385/92; 385/40
(58) Field of Classification Search .................. 385/40, 385/92; 257/40
See application file for complete search history.

(56) References Cited

U.S. PATENT DOCUMENTS

| | | | |
|---|---|---|---|
| 4,931,794 A * | 6/1990 | Haag et al. .................... 341/31 |
| 5,005,939 A * | 4/1991 | Arvanitakis et al. .......... 385/53 |
| 5,235,208 A | 8/1993 | Katoh |
| 6,302,596 B1 * | 10/2001 | Cohen et al. .................. 385/93 |
| 6,461,058 B1 * | 10/2002 | Birch et al. .................... 385/92 |
| 6,600,611 B1 * | 7/2003 | Inujima et al. ............. 359/808 |
| 2003/0072540 A1 * | 4/2003 | Huang .......................... 385/92 |
| 2003/0103736 A1 * | 6/2003 | Brezina et al. ................ 385/92 |

FOREIGN PATENT DOCUMENTS

| | | |
|---|---|---|
| DE | 39 22 800 | 1/1992 |
| DE | 19 832 710 | 1/2000 |
| DE | 10 013 844 | 9/2001 |
| EP | 0 326 207 A1 | 8/1989 |
| JP | 11196055 | 7/1999 |
| WO | WO 1/42840 A1 | 6/2001 |

OTHER PUBLICATIONS

International Search Report, PCT/SE02/02141, Swedish Patent Office, Jan. 30, 2003.

* cited by examiner

*Primary Examiner*—Ellen E. Kim
(74) *Attorney, Agent, or Firm*—Workman Nydegger

(57) ABSTRACT

The present invention relates to an optoelectrical unit for converting information signals between an electrical signal format and an optical signal format. The proposed unit includes a circuit board, which contains at least one optoelectrical capsule. Each capsule is positioned on the circuit board, such that its footprint towards the circuit board has a smaller area than the area of a largest side of the capsule. Moreover, each capsule includes a feedthrough, which electrically connects one or more components therein to circuitry on the circuit board via a plurality of leads. The feedthrough also contains a shield, which electrically shields at least one signal lead from at least one auxiliary lead. The feedthrough is adapted for positioning the optoelectrical capsule at an arbitrary adapted location on the circuit board.

13 Claims, 4 Drawing Sheets

US 7,025,510 B2

MODULAR FIBER-OPTIC TRANSCEIVER

FIELD OF THE INVENTION

The present invention relates generally to optimization of optical communication equipment with respect to size and volume. More particularly the invention relates to an optoelectrical unit for converting information signals between an electrical signal format and an optical signal format according to the preamble of claim 1.

THE BACKGROUND OF THE INVENTION AND PRIOR ART

Optical communication systems transport information in the form of modulated light signals. A laser module, e.g. a semiconductor laser (laser=light amplification by stimulated emission of radiation) in a signal transmitter unit is here normally used in order to accomplish the optical signals on basis of electrical ditto, and a photodetection module, e.g. a photodiode, in a signal receiver unit typically converts the optical signals back into electrical signals again. In most cases, the signal transmitter unit and a corresponding signal receiver unit are co-located to form an optoelectrical transceiver unit.

The above transmitter and receiver units should generally be as small as possible with the aim of concentrating the number of processed information bits per physical volume unit and thereby reduce the overall size of the optical communication equipment. For the same reason, the units should also be placed as close as possible to each other.

Traditionally, the transmitter and receiver units are placed in a respective indentation in the circuit board. Furthermore, the units are usually oriented with their largest side in parallel with the circuit board, such that they show a largest possible interface area towards a heat sink below and/or above the circuit board. This design, however, places a theoretical lower limit as to the circuit board area required to house a certain number of units, which basically is proportional to the area of the largest unit sides. Moreover, the assembly of such a transceiver becomes relatively complex, particularly if the units are positioned very close to each other.

The document WO01/42840 discloses a modular fiber-optic transceiver, which includes a sub-assembly stack mounted with its largest sides oriented perpendicular to the circuit board. Thereby, it appears possible to place rather many sub-assembly stacks per area unit on the circuit board. Specifically, the document proposes a first design where a standard single solder pin array connects the sub-assembly to the transceiver board. This design limits the data rate of the signals that are fed to or from the sub-assembly to a relatively low value, such that the design may only be used for low capacity optical processing modules. According to a second proposed design, a so-called flexible cable band instead attaches the sub-assembly to the transceiver board. Thereby, a higher data rate is enabled. However, the signal shielding is still inadequate and the mounting of the optoelectrical components becomes very complicated. Moreover, the flexible cable band approach severely limits the potential areas in which the sub-assembly may be positioned on the transmitter board.

SUMMARY OF THE INVENTION

An object of the present invention is therefore to provide an optoelectrical unit that alleviates the problems above and thus offers a solution, which is comparatively efficient with respect to the processing capacity per area and volume unit, is reasonably uncomplicated and straight-forward to assemble, and at the same time allows a relatively high number of electrical connections between the optoelectrical capsule and the circuit board onto which it is mounted.

According to the invention these objects are achieved by an optoelectrical unit as initially described, which is characterized in that the feedthrough contains a shield that electrically shields at least one signal lead from at least one auxiliary lead. Furthermore, the feedthrough is adapted for positioning the capsule at an arbitrary adapted location on the circuit board.

Important advantages attained thereby are that the valuable circuit board area is economized and that signals having comparatively high data rates may be sent with low distortion via the at least one signal lead.

According to a preferred embodiment of the invention, the feedthrough extends exclusively over one side of the capsule which faces the circuit board. Thereby, the lead length between the capsule and the circuit board onto which it is mounted can be minimized, and thus the risk of undesired interference between the signals fed to and/or from the capsule and other signals may be held relatively low.

According to another preferred embodiment of the invention, the shield is connected to an external ground potential via the circuit board. This is advantageous, since thereby a shielding is obtained which is adequate for most high-frequency applications.

According to yet another preferred embodiment of the invention, the shield exclusively surrounds the at least one signal lead. Naturally, this minimizes the risk of undesired signal interference and is therefore advantageous.

According to still another preferred embodiment of the invention, the at least one capsule has the general shape of a rectangular parallelepiped with two relatively large area sides and four relatively small area sides. Naturally, this does not imply that the capsule shape must represent a mathematically perfect rectangular parallelepiped. On the contrary, its sides may be more or less tilted with respect to each other, such that they are either all pair wise parallel to each other or at least two opposite sides being non-parallel to each other. For example, the capsule may describe a truncated pyramid. Moreover, one or more of the capsule's edges and/or corners may be rounded. In any case, the capsule is positioned on the circuit board such that its relatively large area sides are oriented substantially perpendicular to a component side of the circuit board. An advantage accomplished by placing the capsule on its edge like this is that the capsule thereby not only shows a relatively small footprint on the circuit board, a relatively large capsule area also becomes readily accessible for cooling purposes.

As mentioned initially, one capsule may contain a laser unit, which receives a first electrical information signal and produces in response thereto a first optical information signal. Correspondingly, another capsule may contain a photodetection unit, which receives a second optical information signal and produces in response thereto a second electrical information signal.

According to a preferred embodiment of the invention, each capsule contains a particular warmest side, which radiates more heat energy than any one of the other sides of the capsule. Such concentration of the power losses is advantageous, since it improves the possibilities of accomplishing an efficient cooling via, for example, an air cooled heat sink along the warmest side.

According to yet a preferred embodiment of the invention, the warmest side is one of the relatively large area sides. This is desirable, since it further increases the chances of achieving an adequate cooling of the capsule.

According to another preferred embodiment of the invention, the optoelectrical unit comprises at least two capsules, which are positioned in relative proximity to each other on the circuit board. Preferably, these capsules are positioned with their warmest sides substantially perpendicular to each other, such that they form a general L-shape pattern on the circuit board. A common heat sink can namely thereby efficiently cool both capsules, either on the inside of the L-shape or on the outside thereof.

According to a further preferred embodiment of the invention, the primary heat sink contains at least two surfaces, which are substantially parallel and relatively proximate to at least the warmest sides. This warrants for a good thermal coupling between the capsule and the heat sink.

According to another preferred embodiment of the invention, the heat sink is adapted to receive heat energy being dissipated from at least one circuit element in addition to the at least one capsule. Such sharing of the cooling resources is advantageous both from a thermal and a complexity point of view.

According to another preferred embodiment of the invention, the at least one capsule contains a thermoelectric module, which actively transports heat energy from an optoelectrical component inside the capsule towards the capsule exterior. Naturally, this further increases the efficiency of the cooling of the optoelectrical component inside the capsule.

To sum up, the invention offers a solution for optical communication equipment, which is highly efficient with respect to the space required per processed piece of information. At the same time, the proposed solution results in a comparatively simple assembly of the unit. The invention will therefore provide a competitive edge to any communication system where optical transmitters are utilized for the transmission of information.

BRIEF DESCRIPTION OF THE DRAWINGS

The present invention is now to be explained more closely by means of preferred embodiments, which are disclosed as examples, and with reference to the attached drawings.

DESCRIPTION OF PREFERRED EMBODIMENTS OF THE INVENTION

Figure 1:
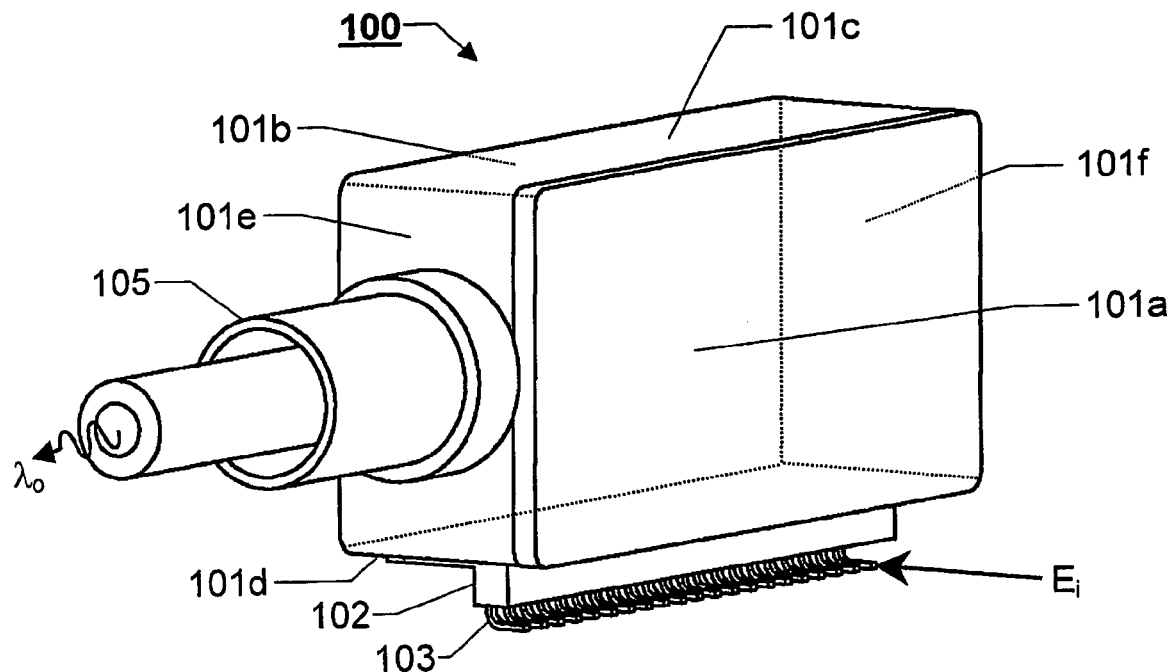
FIG. 1 shows a capsule containing a laser unit according to an embodiment of the present invention.

Conventionally, the optoelectrical units (such as lasers and photodetectors) in optoelectrical transceivers have been oriented with their largest side in parallel with the circuit board on which they are mounted. This accomplishes a largest possible interface area towards at least one heat sink being placed either below, above or both below and above the circuit board. As mentioned earlier, this design results in a relatively large footprint for each optoelectrical unit, which in turn consumes valuable circuit board area that could have been used by other units. Therefore, the present invention proposes that the optoelectrical units instead be placed on their edges, i.e. with a capsule side having a comparatively small area towards the circuit board. FIG. 1 shows a first example of this strategy, where a capsule 100 containing a laser unit stands on one of its relatively small area sides 101$d$. The laser capsule 100 is presumed to have the general shape of a rectangular parallelepiped with two relatively large area sides 101$a$; 101$b$ and four relatively small area sides 101$c$, 101$d$, 101$e$ and 101$f$. The latter may either all have substantially the same size, or as illustrated in FIG. 1, have two somewhat larger sides 101$c$; 101$d$ and two somewhat smaller sides 101$e$; 101$f$. Although the exact relationship between the relatively large area sides 101$a$; 101$b$ and the relatively small area sides 101$c$–$f$ is not critical for the proposed solution, the relatively large area sides 101$a$; 101$b$ should preferably have at least 50% larger area than the largest of the relatively small area sides 101$c$–$f$. It is furthermore advantageous, from an assembly point of view, if the capsule 100 is mounted such that the relatively large area sides 101$a$; 101$b$ are oriented substantially perpendicular to the circuit board. A feedthrough 102 in the bottom side 101$d$ of the capsule 100 contains one or more electrical leads 103 via which an incoming electrical signal $E_i$ is received to the laser unit. Preferably, the electrical leads 103 constitute ceramic conductors in the feedthrough 102 in order to make possible a high lead density, such that a large number of leads may be fed via a comparatively small interface area towards the circuit board onto which the capsule 100 is mounted. Moreover, the feedthrough 102 need thereby only extend over one side 101$d$ of the capsule 100. This design minimizes the lead length between the capsule 100 and the circuit board and is consequently advantageous from an interference point-of-view. The laser unit produces an outgoing optical signal $\lambda_o$ in response to the electrical signal $E_i$ that represents the same information. The optical signal $\lambda_o$ is fed out from the capsule 100 to an optical fiber (not shown) via an optical connector 105, for example of LC-type (Lucent), SC-type (subscriber connector) or MU-type (NTT). Here, the optical connector 105 is attached to one of the relatively small area sides 101$e$. Technically however, it may equally well be attached to one of the relatively large area sides 101$a$ or 101$b$.

According to a preferred embodiment of the invention, one of the relatively large area sides 101$a$ radiates more heat energy than any one of the other sides 101$b$–101$f$. I.e. this relatively large area side 101$a$ is the warmest side of the capsule 100. For example, this may be due to the fact that the laser unit is mounted on the inside of this side 101$a$ (see FIG. 3). The capsule 100 may also contain a thermoelectric module (such as a Peltier device), which actively transports heat energy from the laser unit towards this particular side 101$a$ of the capsule 100 exterior.

Figure 2:
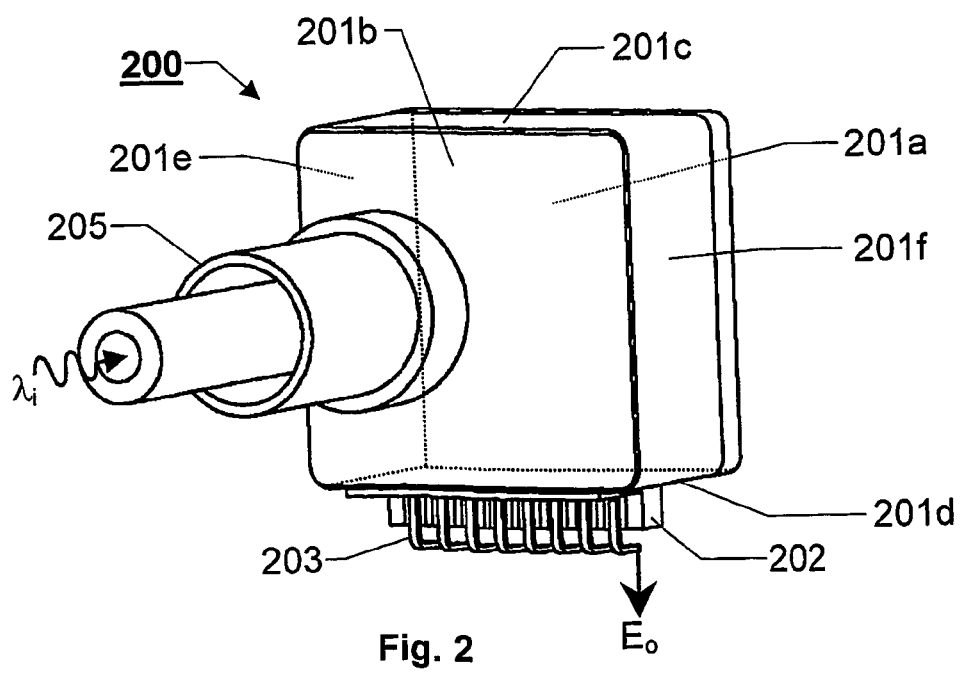
FIG. 2 shows a capsule containing a photodetection unit according to an embodiment of the present invention.

FIG. 2 shows a second example of a capsule 200 that contains an optoelectrical unit according to an embodiment of the present invention. In analogy with the capsule 100 shown in FIG. 1 above, the photodetection capsule 200 is presumed to have the general shape of a rectangular parallelepiped with two relatively large area sides 201$a$; 201$b$ and four relatively small area sides 201$c$, 201$d$, 201$e$ and 201$f$. The photodetection capsule 200 is intended to stand on one of its relatively small area sides 201d on a circuit board. As is apparent from the figure, the relatively small area sides 201c–f all have approximately the same size. However, the relatively small area sides 201c–f may equally well have sizes, which are substantially different in pairs, i.e. represent two somewhat larger sides and two somewhat smaller sides. Although again, the exact relationship between the relatively large area sides 201a; 201b and the relatively small area sides 201c–f is not critical for the proposed solution, the relatively large area sides 201a; 201b should preferably have at least 50% larger area than the largest of the relatively small area sides 201c–f. It is furthermore advantageous, from an assembly point of view, if the capsule 200 is mounted such that the relatively large area sides 201a; 201b are oriented substantially perpendicular to the circuit board.

According to a preferred embodiment of the invention, the capsule 200 receives an incoming optical signal $\lambda_i$ from, for example, an optical fiber (not shown) via an optical connector 205 on one of the capsule's 200 relatively large area sides 201b. Preferably, if the optical connector 105 referred to above is attached to one of the relatively small area sides 101c–f of the laser capsule 100, the optical connector 205 is attached to one of the relatively large area sides 201a or 201bf of the photodetection capsule 200, and vice versa. The optical connector 205 may for instance be of LC-type (Lucent), SC-type (subscriber connector) or MU-type (NTT). The photodetection unit within the capsule 200 converts the optical signal $\lambda_o$ into a corresponding electrical signal $E_o$ that represents the same information. A feedthrough 202 in a bottom side 201d of the capsule 200 contains one or more electrical leads 203 via which the electrical signal $E_o$ is delivered to other circuit elements for further processing. Preferably, the electrical leads 203 constitute ceramic conductors in the feedthrough 202 in order to make possible a high lead density, which in turn allows the feedthrough 102 to extend over one side 201d of the capsule 200. As mentioned above with reference to FIG. 1, this is advantageous from an interference point-of-view.

According to a preferred embodiment of the invention, one of the relatively large area sides 201a radiates more heat energy than any one of the other sides 201b–201f and is thus the warmest side of the capsule 200. For example, this may be due to the fact that the photodetection unit is mounted on the inside of this particular side 201a. Preferably, the capsule 200 may also contain a thermoelectric module (such as a Peltier device), which actively transports heat energy from the photodetection unit towards the warmest side 201a of the capsule 200 exterior.

Figure 3:
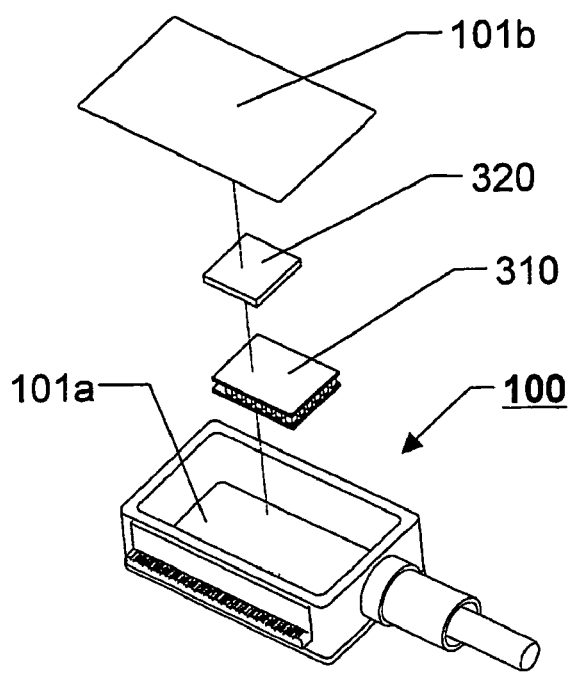
FIG. 3 shows an exploded diagram over a laser capsule according to an embodiment of the invention.

FIG. 3 shows an exploded diagram over a laser capsule 100 according to an embodiment of the invention. Here, an optoelectrical component in the form of a laser unit 310 is mounted on the inside of a side 101a of the laser capsule 100. A control circuitry 320 for the laser unit 310 is in turn positioned on top of this unit 310. Preferably, the capsule 100 also contains a thermoelectric module (not shown), which actively transports heat energy from the laser unit 310 towards the exterior of the capsule side 101a. A capsule side 101b in the form of a lid is used to seal the capsule 100 after assembly of the units therein.

Figure 4:
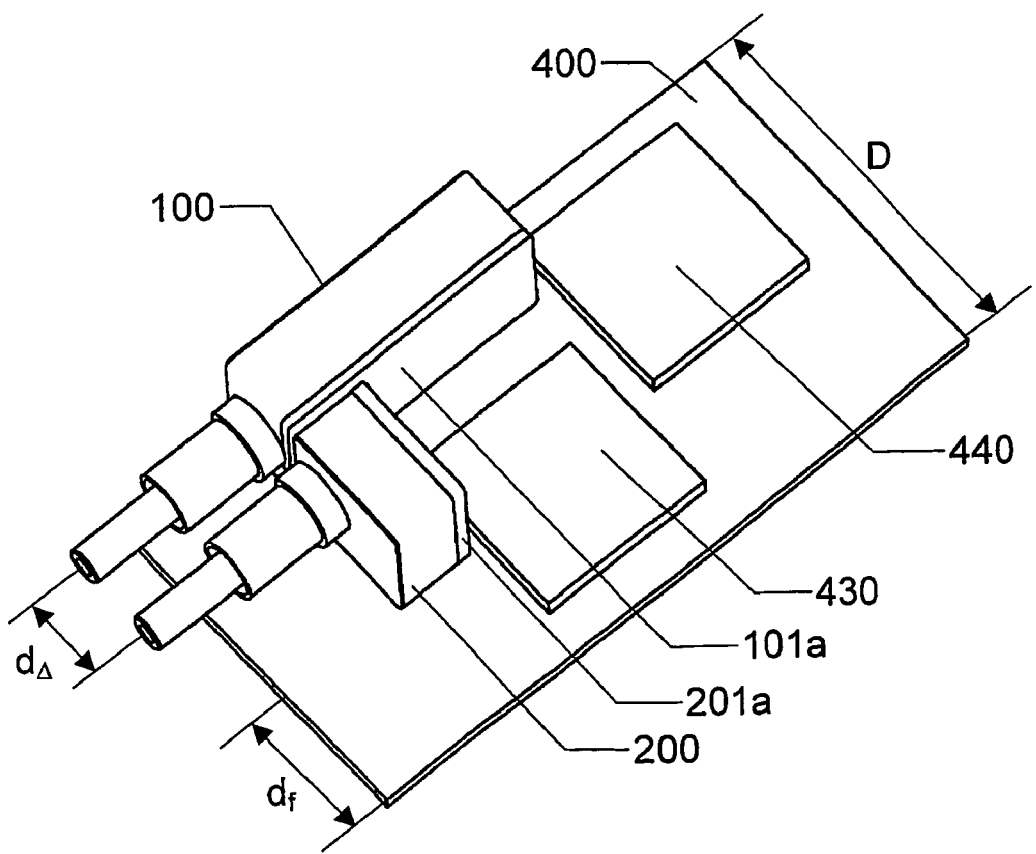
FIG. 4 depicts a circuit board according to an embodiment of the invention, which comprises the capsules shown in FIGS. 1–3.

FIG. 4 depicts a circuit board 400 according to an embodiment of the invention, which comprises a laser capsule 100 and a photodetection capsule 200 as described above. Both these capsules 100 and 200 are positioned on the circuit board 400 such that their relatively large area sides 101a, 101b and 201a, 201b respectively are oriented substantially perpendicular to a component side of the circuit board 400. For a given width D of the circuit board 400, this leaves a relatively large front space $d_f$ that can be used for other purposes than connecting optical fibers, for example displays (not shown) to indicate a transceiver status. Moreover, the distance dΔ between the optical connectors 105 and 205 can thereby be made comparatively short.

The capsules 100 and 200 are here presumed to have a respective warmest side 101a and 201a. Preferably, the capsules 100 and 200 are positioned relatively close to each other with their warmest sides 101a; 201a substantially perpendicular to each other, such that the capsules 100 and 200 form a general L-shape pattern on the circuit board 400. Furthermore, the circuit board 400 may include a first circuit 430 and a second circuit 440 in addition to the capsules 100 and 200, for instance for pre- and post-processing of the electrical signals $E_i$ and $E_o$.

Figure 5:
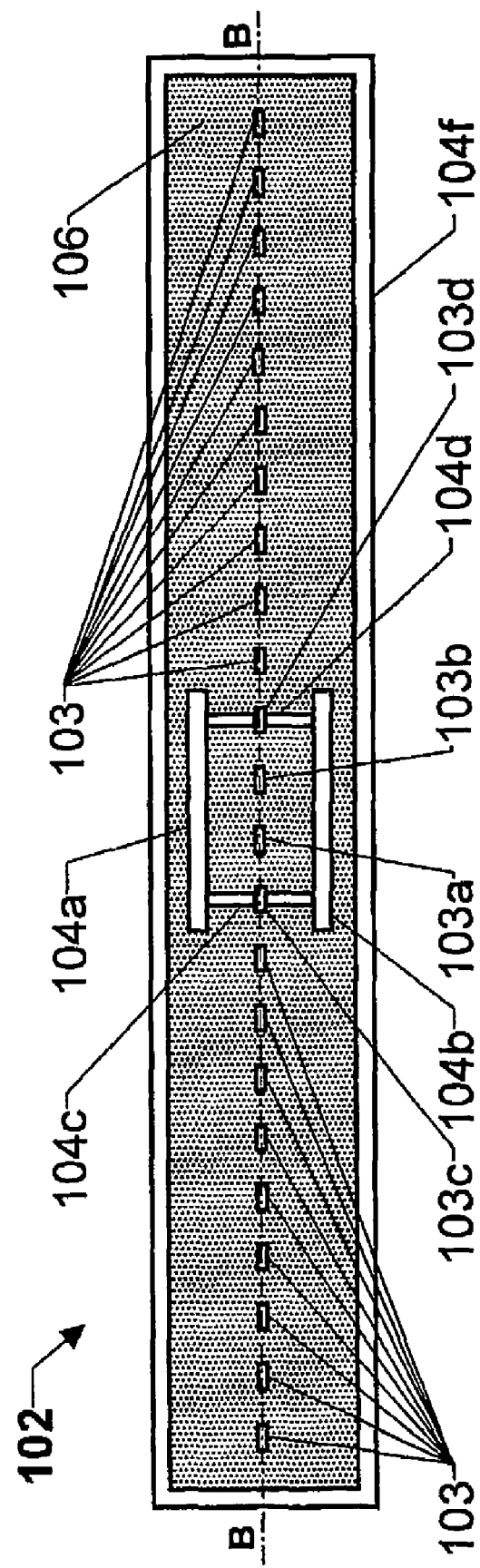
FIG. 5 shows a cross-section view of a proposed ceramic feedthrough interconnection for the capsules shown in FIGS. 1–3.

FIG. 5 shows a cross-section view of a mid section of the ceramic feedthrough interconnection assembly 102. The figure represents a view in parallel with the electrical leads 103a–d; 103 in the feedthrough 102. The feedthrough 102 contains two signal leads 103a and 103b for receiving or transmitting an electrical information signal on a differential format. The feedthrough 102 also includes a multitude of auxiliary leads 103, which may be used to transport other signals to and from the capsule 100, for example in the form of control commands or measurement data. Moreover, two leads 103c and 103d in the feedthrough 102 are adapted for attaching an external ground potential. These leads 103c; 103d are each further connected to conducting bars (or equivalent connectors) 104c; 104d. The conducting bars 104c; 104d, in turn, are electrically connected to a respective metal plate 104a above and 104b below the signal leads 103a; 103b. Hence, the metal plates 104a; 104b, the conducting bars 104c; 104d and the ground leads 103c; 103d together form a shield around the signal leads 103a; 103b. Provided that the ground leads 103c; 103d are attached to the ground potential, the shield also attains the ground potential.

Preferably, the shield 103c, 103d, 104a, 104b, 104c and 104d exclusively surrounds the signal leads 103a; 103b. In other words, no leads other than the signal leads 103a and 103b are present behind the shield. The shield thereby efficiently shields the signal leads 103a and 103b electrically from the auxiliary leads 103. A ceramic 106, which is electrically non-conductive and has a known and well-defined dielectric constant fills the entire space between the leads 103, 103a, 103b and the shield 103c, 103d, 104a, 104b, 104c and 104d in the feedthrough 102. However, in an outermost section of the feedthrough 102 one or more non-ceramic materials may adjoin the leads 103, 103a, 103b and/or the shield 103c, 103d, 104a, 104b, 104c.

Conventionally, the optoelectrical units (such as lasers and photodetectors) in optoelectrical transceivers have been oriented with their largest side in parallel with the circuit board on which they are mounted. A largest possible interface area has thereby been accomplished towards at least one heat sink being placed either below, above or both below and above the circuit board. This design, however, results in a relatively large foot-print for each optoelectrical unit, which in turn consumes valuable circuit board area that could have been used by other units. Therefore, the present invention proposes that the optoelectrical units instead be placed such that they show a face with considerably smaller area towards the circuit board.

Figure 6:
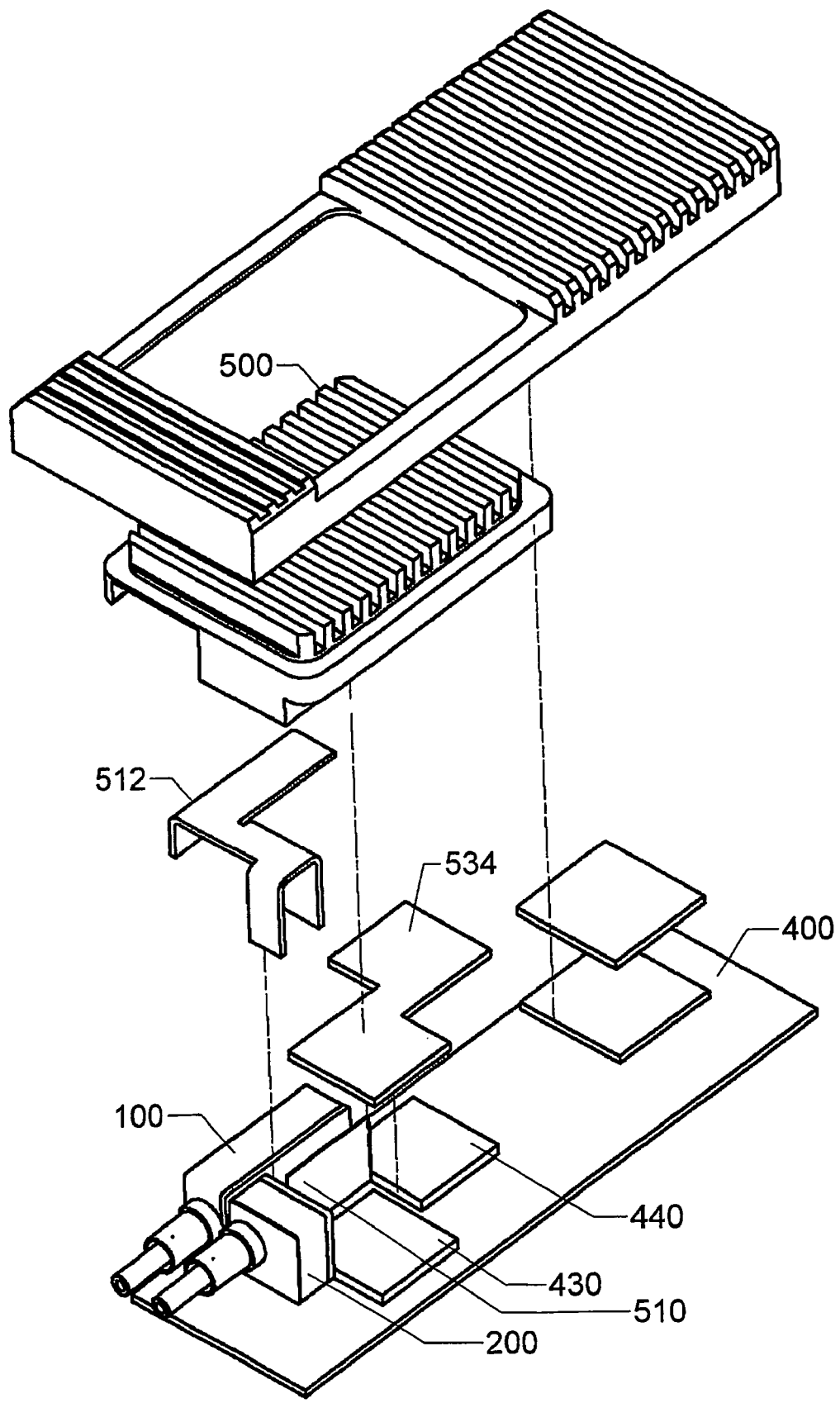
FIG. 6 represents an exploded diagram over an entire optoelectrical unit according to an embodiment of the invention.

FIG. 6 represents an exploded diagram over an entire optoelectrical unit according to an embodiment of the invention. The circuit board 400 here comprises a laser capsule 100, a photodetection capsule 200 and two other circuit elements 430 and 440 respectively. The capsules 100 and 200 and the circuit elements 430 and 440 are positioned in accordance with what has been described with reference to FIG. 4 above.

A first thermo conductive gap filler, e.g. a thermo conductive pad, silicone or an equivalent gel 512 is attached on the top face and/or at least one side face of the capsules 100 and 200 in order to enhance the thermal coupling between the relevant capsule(s) 100; 200 and a heat sink 500. A corresponding second gap filler 510 is attached to the warmest side of the laser capsule 100. Likewise, a third gap filler 534 is attached on the upper surfaces of the circuit elements 430 and 440.

The heat sink 500 is fitted onto the capsules 100 and 200 after attaching the gap fillers 510, 512 and 534. Moreover, the first and second gap fillers 512 and 510 thereby removes any play between the capsules 100; 200 and the heat sink 500. The capsules 100 and 200 thus assists in lining up the heat sink 500 in its intended position.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

What is claimed is:

1. An optoelectrical unit for converting information signals between an electrical signal format and an optical signal format, comprising a circuit board which contains at least one optoelectrical capsule which is positioned on the circuit board such that its footprint towards the circuit board has a smaller area than the area of a largest side of the at least one capsule, each of the at least one capsule including a feedthrough which electrically connects one or more components inside the respective capsule to circuitry on the circuit board via a plurality of leads, wherein
   the feedthrough contains a shield which electrically shields at least one signal lead from at least one auxiliary lead, the shield is connected to an external ground potential via the circuit board, and
   the feedthrough is adapted for positioning the at least one capsule at an arbitrary adapted location on the circuit board.

2. An optoelectrical unit according to claim 1, wherein the feedthrough extends exclusively over one side of the capsule, and said side faces the circuit board.

3. An optoelectrical unit according to claim 1, wherein the shield exclusively surrounds the at least one signal lead.

4. An optoelectrical unit according to claim 1, wherein
   the at least one capsule has the general shape of a rectangular parallelepiped with two relatively large area sides and four relatively small area sides, and
   the at least one capsule is positioned on the circuit board such that its relatively large area sides are oriented substantially perpendicular to a component side of the circuit board.

5. An optoelectrical unit according to claim 4, wherein each of the at least one capsule contains a particular warmest side radiating more heat energy than any one of the other sides of the respective capsule.

6. An optoelectrical unit according to claim 5, wherein the warmest side is one of the relatively large area sides.

7. An optoelectrical unit according to claim 5, wherein the unit comprises at least two capsules being positioned in relative proximity to each other on the circuit board.

8. An optoelectrical unit according to claim 7, wherein said at least two capsules are positioned with their warmest sides substantially perpendicular to each other such that at least two of said at least two capsules form a general L-shape pattern on the circuit board.

9. An optoelectrical unit according claim 8, wherein the unit comprises at least one heat sink containing at least two surfaces being substantially parallel and relatively proximate to said warmest sides.

10. An optoelectrical unit according to claim 9, wherein the at least one heat sink is adapted to receive heat energy being dissipated from at least one circuit element in addition to the at least two capsules.

11. An optoelectrical unit according to claim 1, wherein at least one of the at least one capsule contains a laser unit receiving a first electrical information signal and producing in response thereto a first optical information signal.

12. An optoelectrical unit according to claim 1, wherein at least one of the at least one capsule contains a photodetection unit receiving a second optical information signal and producing in response thereto a second electrical information signal.

13. An optoelectrical unit according to claim 1, wherein at least one of the at least one capsules contains a thermoelectric module actively transporting heat energy from an optoelectrical component inside the capsule towards the capsule exterior.

* * * * *

UNITED STATES PATENT AND TRADEMARK OFFICE
CERTIFICATE OF CORRECTION

PATENT NO. : 7,025,510 B2 Page 1 of 1
APPLICATION NO. : 10/495938
DATED : April 11, 2006
INVENTOR(S) : Lindberg et al.

It is certified that error appears in the above-identified patent and that said Letters Patent is hereby corrected as shown below:

Column 1
Line 7, after "particularly", insert --,--
Line 18, remove "here"
Line 44, change "WO01/42480" to --WO 01/42480--

Column 2
Lines 18-25, remove "According to a preferred embodiment… held relatively low"
Line 26, change "another" to --a--
Line 31, remove "yet"
Line 35, remove "still"

Column 3
Line 1, change "yet a" to --another--

Column 4
Line 16, remove "either"
Line 44, after "example", change "of" to --an--

Signed and Sealed this

Eighteenth Day of September, 2007

JON W. DUDAS
*Director of the United States Patent and Trademark Office*